US006980075B2

(12) United States Patent  
Mheen et al.

(10) Patent No.: US 6,980,075 B2  
(45) Date of Patent: Dec. 27, 2005

(54) INDUCTOR HAVING HIGH QUALITY FACTOR AND UNIT INDUCTOR ARRANGING METHOD THEREOF

(75) Inventors: Bongki Mheen, Daejon (KR); Seok-bong Hyun, Daejon (KR); Dong Woo Suh, Daejon (KR); Jin-Yeong Kang, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 70 days.

(21) Appl. No.: 10/714,287

(22) Filed: Nov. 13, 2003

(65) Prior Publication Data

US 2004/0100349 A1 May 27, 2004

(30) Foreign Application Priority Data

Nov. 14, 2002 (KR) ...................... 10-2002-0070748

(51) Int. Cl.[7] .............................................. H01F 5/00
(52) U.S. Cl. ...................................... 336/200; 257/531
(58) Field of Search ............................. 336/180–183, 336/192, 200, 232; 257/531

(56) References Cited

U.S. PATENT DOCUMENTS

| 5,545,916 | A | | 8/1996 | Koullias | |
|---|---|---|---|---|---|
| 5,610,433 | A | | 3/1997 | Merrill et al. | |
| 5,831,331 | A | * | 11/1998 | Lee | 257/659 |
| 6,002,161 | A | * | 12/1999 | Yamazaki | 257/531 |
| 6,380,608 | B1 | * | 4/2002 | Bentley | 257/531 |
| 6,549,112 | B1 | * | 4/2003 | Gallina et al. | 336/200 |

FOREIGN PATENT DOCUMENTS

| JP | 10-163028 | 11/1996 |
|---|---|---|
| KR | 1020000019683 | 4/2000 |

OTHER PUBLICATIONS

1998 IEEE Radio Frequency Integrated Circuits Symposium, pp. 217-220.

* cited by examiner

*Primary Examiner*—Tuyen T Nguyen
(74) *Attorney, Agent, or Firm*—Woodcock Washburn LLP (57) ABSTRACT

A method for arranging unit inductors of an inductor having metal wiring that can make a full use of self-inductance and mutual-inductance which are determined based on the proportion of the area of an unit inductor and the proportion of the overlapping area with another unit inductor, and an inductor adopting the unit inductor arranging method. The unit inductor arranging method, wherein the inductor includes a first unit inductor, a second inductor and a third inductor, and self-inductance magnitudes of the unit inductors are in the order of the self-inductance of the third inductor>the self-inductance of the second inductor>the self-inductance of the first inductor, includes the steps of: a) coupling one end of the second unit inductor is connected to one end of the first unit inductor and one end of the third unit inductor to the other end of the first unit inductor in order to arrange the first unit inductor between the second and third unit inductors of which mutual-inductance has the largest value in mutual-inductances between the unit inductors; b) coupling the second unit inductor to a first external terminal; and c) coupling the third unit inductor to a second external terminal.

6 Claims, 7 Drawing Sheets

FIG. 7

INDUCTOR HAVING HIGH QUALITY FACTOR AND UNIT INDUCTOR ARRANGING METHOD THEREOF

FIELD OF THE INVENTION

The present invention relates to an inductor; and, more particularly, to a method for arranging unit inductors of an inductor that can increases a quality factor (Q) and an inductor adopting the unit inductor arrangement.

DESCRIPTION OF RELATED ART

A wound coil or wire is called as an inductor. The windings increase magnetic flux and the increased magnetic flux raises the self-inductance of the wire.

Such inductors are used in radio frequency design of a resonance circuit, a filter, a delay network or a phase shifter, and a radio frequency choke which prohibits radio frequency energy from flowing through a certain circuit. Inductors are very sensitive to the change of frequency more than other electronic devices, e.g., resistance.

Figure 1:
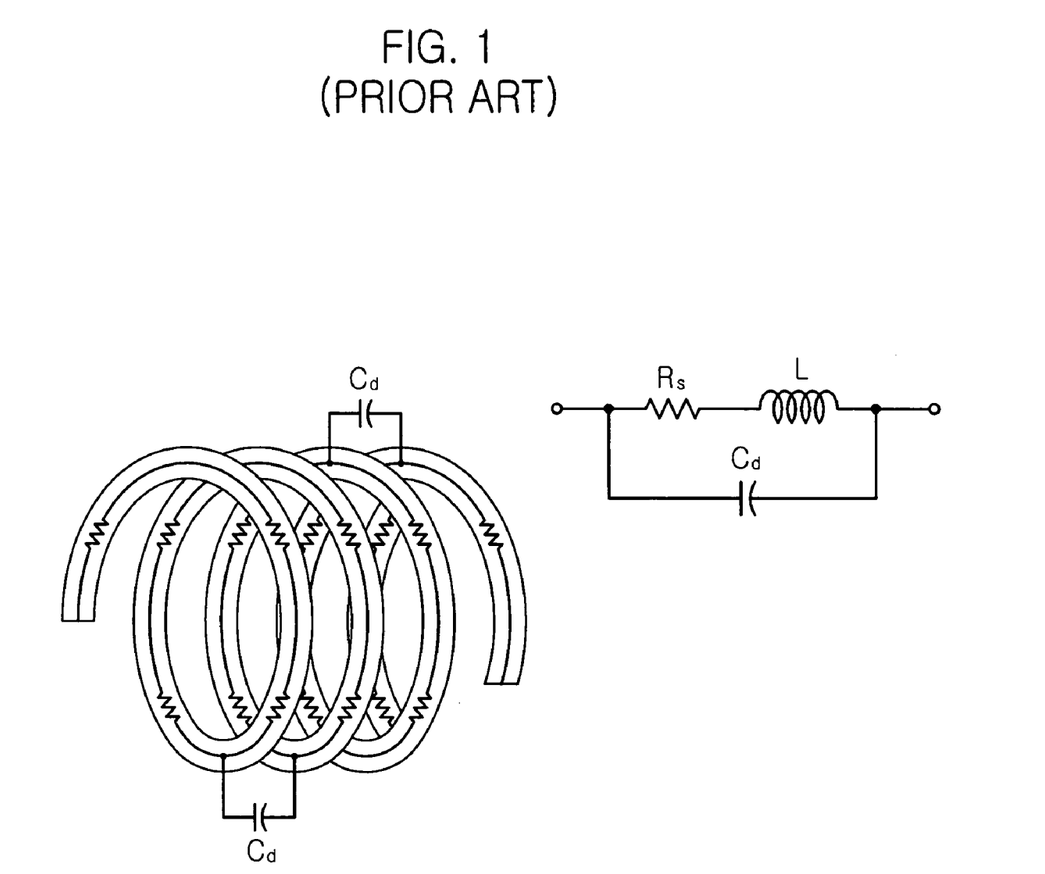
FIG. 1 shows an equivalent circuit and a diagram depicting distributed capacitance and serial resistances within the distributed capacitance, when an inductor is operated by a radio frequency.
Figure 2:
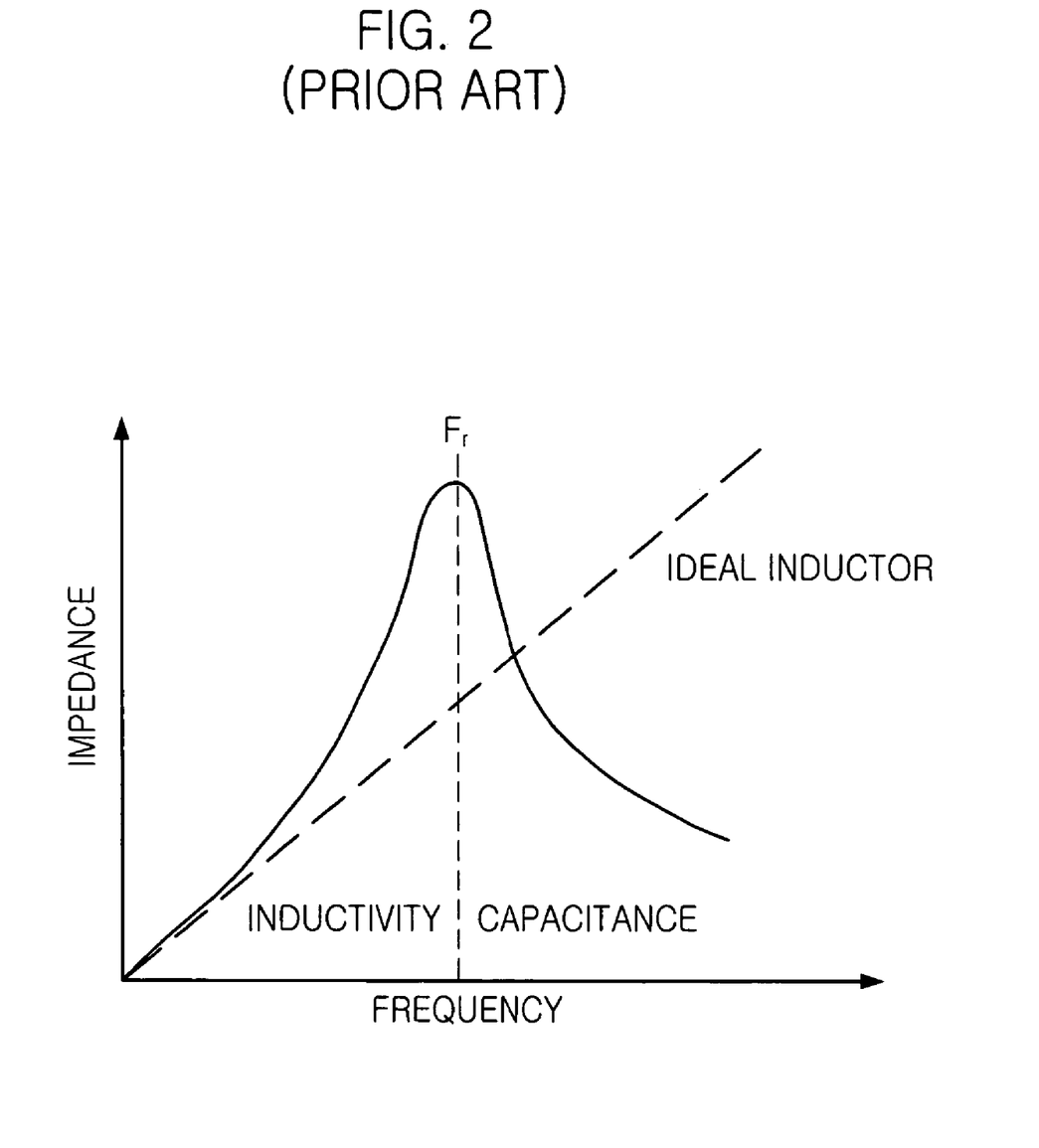
FIG. 2 is a graph illustrating impedance and frequency characteristics of an ideal inductor.

FIG. 1 shows an equivalent circuit and a diagram depicting distributed capacitance and serial resistances within the distributed capacitance, when an inductor is operated by a radio frequency. FIG. 2 is a graph illustrating impedance and frequency characteristics of an ideal inductor.

Referring to FIG. 1, an inductor includes a serial of resistance Rs and inductance L, and distributed capacitance connected to the serial resistance Rs in parallel.

When two conductors are put closely to each other and separated by a dielectric substance and electric potential difference between the conductors is generated, the result is the same as a capacitor existing between the two conductors. In FIG. 1, it can be regarded that a very little capacitor exists between two turns of the coil. The capacitance of such imaginary capacitor is referred to as distributed capacitance Cd.

FIG. 2 shows the influence of the distributed capacitance Cd on the reactance (X) of the inductor. At low frequencies, the reactance of an actual inductor is the same as that of an ideal inductor. However, as frequencies are increased, the reactance of the actual inductor goes different from that of the ideal inductor. It surges up dramatically and becomes the maximum at a resonance frequency. Then, when the frequency is increased higher than the resonance frequency Fr, the reactance of the actual inductor is decreased rapidly. From this aspect, it can be seen that the inductor works just as a capacitor when the frequency is higher than the resonance frequency.

Theoretically, infinite impedance is generated at a peak (P) of reactance X. However, due to the serial resistances Rs of the coil, a definite value of impedance can be obtained at the resonance frequency, i.e., the peak of reactance. The serial resistance Rs of the coil also expands the resonance peak of the coil impedance curve.

The ratio of reactance X to the serial resistances Rs of the inductor is referred to as a quality factor Q, which is expressed as Equation 1.

$$Q = X/R_S \quad \text{Eq. 1}$$

The larger the quality factor Q becomes, the better quality of the inductor is. Therefore, if the wire has no resistance, the quality factor Q becomes infinitely large to become an inductor having no loss. However, since every inductor has resistance, inductors have a quality factor Q of a regular figure.

At a low frequency, the quality factor Q of an inductor is very large because the winding resistance is relatively small and the parasitic capacitance is reduced dramatically. However, at a high frequency, the quality effect Q becomes smaller due to skin effect and winding capacitance.

Followings are methods for expanding the range of available frequencies by increasing the quality factor Q of an inductor.

1) a thick wire, which has a larger diameter, is used. The thicker the wire becomes, the smaller the direct current (DC) resistance and alternating current (AC) resistance are.

2) The gap between the rings of the winding is widened. The dielectric constant of air is 1 and it is a very small value among those of other insulators. If the gap between the rings of the winding is widened even a little, the capacitance between windings becomes small.

3) Permeability of magnetic flux is increased. If a magnetic core material, such as iron and ferrite, is wound with an inductor, the permeability of the magnetic flux is increased. If the coil is wound, a desired inductance can be obtained, even though it is wound very little.

Meanwhile, as the inductors are integrated through a semiconductor fabrication process, devices become smaller. However, the miniaturization has increased the quality factor and produced many limitations. As a result of the efforts for overcoming such limitation, the inductor integration technology has made a great progress.

Conventionally, inductors are designed in a plane shape to form an integrated thin film-like inductor, or they are formed by performing plating and forming high metal wires. Otherwise, they are formed by using bonding wires and generating inductance, or by using simple accumulating metal wire.

However, the above-mentioned methods have limitations such as, difficult production process, poor reproducibility, low compatibility with conventional semiconductor fabrication process, high production cost and long production time.

Among the conventional inductors, the plane-type inductor is used widely due to economical production cost, fine reproducibility and high compatibility with conventional semiconductor fabrication process.

Figure 3:
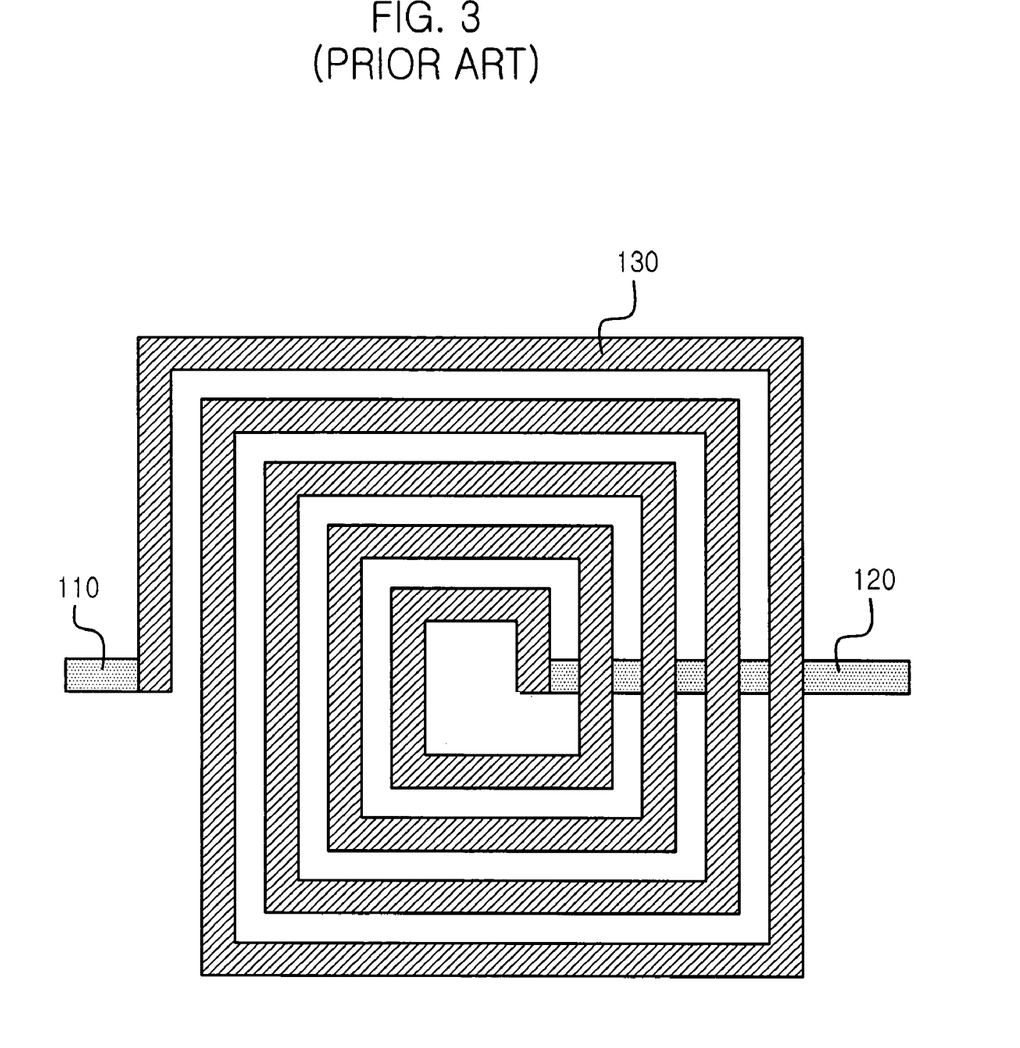
FIG. 3 is a plane figure describing a structure of an integrated plane-type inductor according to prior art.

FIG. 3 is a plane figure describing a structure of an integrated plane-type inductor according to prior art. Referring to FIG. 3, the conventional plane-type inductor includes a first metal wire and a second metal wire in the lower part of the inductor, and a metal wire 130 in the upper part of the inductor. The metal wire 130 is formed in a shape of coil and it has the same inductance as a plurality of unit inductors are connected in serial. Both ends of the metal wire 130 are connected to the first and second metal wires 110 and 120, respectively.

Figure 4:
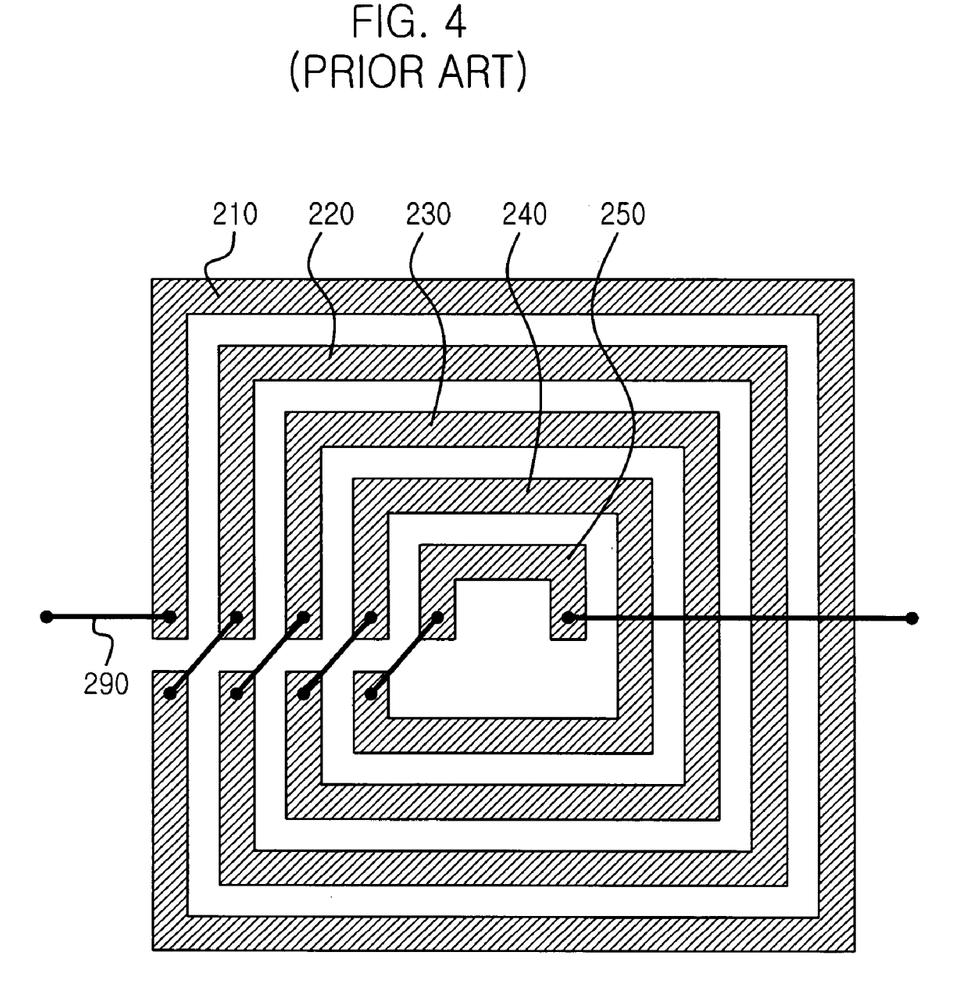
FIG. 4 is a diagram illustrating unit inductors of the inductor shown in FIG. 3.

FIG. 4 is a diagram illustrating unit inductors of the inductor shown in FIG. 3. Referring to FIG. 4, the metal wire 130 which generates inductance is analyzed into unit inductors. The unit inductors are referred to as a first metal wire 210, a second metal wire 220, a third metal wire 230, a fourth metal wire 240, and a fifth metal wire 250. Each unit inductor is connected to another unit inductor through a connection metal wire 290.

Figure 5:
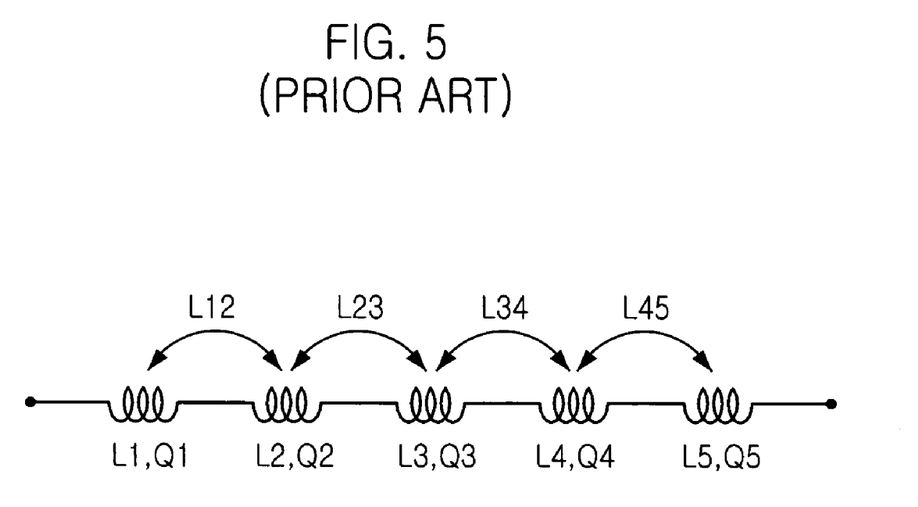
FIG. 5 is a schematic diagram describing unit inductors of FIG. 4 which have self-inductance and mutual-inductance.

FIG. 5 is a schematic diagram describing unit inductors of FIG. 4 which have self-inductance and mutual-inductance. Referring to FIG. 5, the first through fifth unit inductors L1 through L5, which are formed of the metal wire 130 of FIG. 3 and have self-inductances of L11, L22, L33, L44 and L55, respectively, are connected in serial. Between the adjacent unit inductors, mutual-inductances of L12, L23, L34 and L45 are induced.

Each of the self-inductances L11, L22, L33, L44 and L55 and the mutual-inductances L12, L23, L34 and L45 has a different value due to the structure of the plane inductor. The first unit inductor (L1) 210, which is the most outer part of the plane inductor, has the biggest self-inductance L11 among the unit inductances, and then the second unit inductor (L2) 220 has the second biggest self-inductance L12. The self-inductance tends to be decreased in proportion to the size of the unit inductor. This is because self-inductance and mutual-inductance are determined based on the proportion of the area occupied by a unit inductor and the proportion of the area overlapped with the area of another inductor, respectively.

The metal wire 130 of FIG. 3 can be formed not only in a form of square but also in a form of circle or spiral. In case where metal wire can be formed in multiple layers, the value of quality factor Q can be improved by forming the metal wire 130 in multiple layers in the upper part and thus reducing the serial resistance.

The conventional plane-type inductor, however, has a limitation that the overall circuit characteristics cannot be improved due to limited quality factor Q value in spite of the simple structure.

Also, an integrated inductor should be economical, reproducible and compatible with conventional semiconductor fabrication process. At the same time, it should have a high quality factor and, particularly, it should have the maximum quality factor (Q) in the applied frequency band. To satisfy these conditions, all metal wire used for the fabrication of the inductor should have a structure that can generate the maximum inductance and minimize parasitic components.

The conventional plane-type inductor has a simple metal wiring. However, it cannot maximize the inductance and has a poor quality factor. Moreover, it has a problem that it cannot control the frequency to have the maximum quality factor, either.

SUMMARY OF THE INVENTION

It is, therefore, an object of the present invention to provide a method for arranging unit inductors to embody a plane-type inductor that increases self-inductance and mutual-inductance which are determined based on the area of the plane-type inductor.

It is another object of the present invention to provide a plane-type inductor which is embodied by the unit inductor arranging method.

In accordance with an aspect of the present invention, there is provided an inductor, including: a first unit inductor; a second unit inductor of which one end is connected to one end of the first unit inductor and the other end is connected to a first external terminal, the second unit inductor being positioned in the outside of the first unit inductor in a shape of spiral; and a third unit inductor of which one end is connected to the other end of the first unit inductor and the other end is connected to a second external terminal, the third unit inductor being positioned in the outside of the second unit inductor in a shape of spiral, wherein the second unit inductor and the third unit inductor, of which a mutual inductance has a largest value in mutual inductances between unit inductors, are arranged in outer part of the inductor.

In accordance with another aspect of the present invention, there is provided a method for arranging unit inductors of an inductor, wherein the inductor includes a first unit inductor, a second inductor and a third inductor, and self-inductance magnitudes of the unit inductors are in the order of the self-inductance of the third inductor>the self-inductance of the second inductor>the self-inductance of the first inductor, the method including the steps of: a) coupling one end of the second unit inductor is connected to one end of the first unit inductor and one end of the third unit inductor to the other end of the first unit inductor in order to arrange the first unit inductor between the second and third unit inductors of which mutual-inductance has the largest value in mutual-inductances between the unit inductors; b) coupling the second unit inductor to a first external terminal; and c) coupling the third unit inductor to a second external terminal.

In the present invention, the unit inductors are arranged in a pattern different from the conventional simple arrangement to generate a high quality factor and, at the same time, control the frequency that generates the maximum quality factor into a desired frequency band.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

In short, this invention relates to a technology for fabricating an inductor, which is the biggest restrictive element in the fabrication of an integrated circuit. The plane-type inductor causes self-inductance and mutual-inductance between metal wires by using multiple layers of metal wires in the upper part which generates inductance mainly to induce mutual-inductance between the metal wires. The performance of an inductor, i.e., the quality factor Q, can be improved by separating with a dielectric layer the connection metal wire for connecting the metal wires in the upper part of the conventional inductor with each other, and changing the arrangement of unit inductors in the fabrication of a plane-type inductor based on the value of self-inductance and mutual-inductance.

The quality factor of the inductor can be maximized by changing the arrangement of unit inductors into squares into squares, circles and other shapes and, thereby, reducing the characteristics as a capacitor and increasing the inductance characteristics. Also, the maximum quality factor can be generated within a particular frequency range in a type of inductor that can offer desired inductance.

Figure 6:
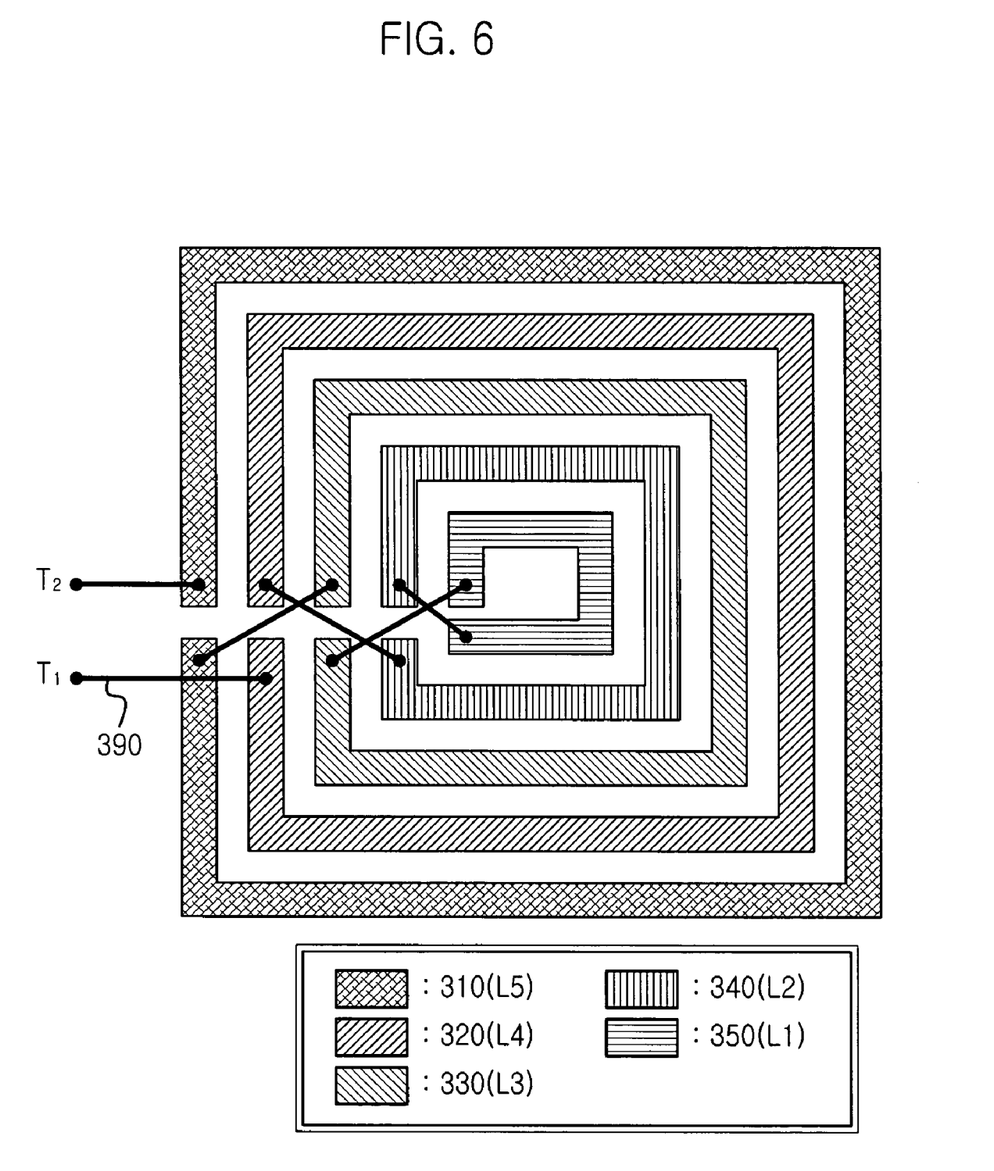
FIG. 6 is a plane figure illustrating a structure of a plane-type inductor in accordance with an embodiment of the present invention.

FIG. 6 is a plane figure illustrating a structure of a plane-type inductor in accordance with an embodiment of the present invention. Referring to FIG. 6, a first unit inductor 350, a second unit inductor 340, a third unit inductor 330, a fourth unit inductor 320 and a fifth unit inductor 310 are arranged in the form of spirals, and each spiral is connected to another metal wires with their ends being crossed over with one ends of them in order to increase mutual-inductance.

To describe it more in detail, the first unit inductor 350 is arranged in a form of spiral at the center of a substrate (not shown). On the outer side of the first unit inductor 350, the second unit inductor 340 is placed. One end of the second unit inductor 340 is connected to one end of the first unit inductor 350. On the outline of the second unit inductor 340, the third unit inductor 330 is positioned, and then the fourth unit inductor 320 and the fifth unit inductor 310 are arranged in the form of spiral on the outlines of the third unit inductor 330 and the fourth unit inductor 320, respectively. All the unit inductors are connected to each other through connection metal wire 390.

One end of the third unit inductor 330 is connected to the other end of the first unit inductor 350, and the other end of the third unit inductor 330 is connected to one end of the fifth unit inductor 310. One end of the fourth unit inductor 320 is connected to the other end of the second unit inductor 340, and the other end of the fourth unit inductor 320 is connected to a first external terminal T1. The other end of the fifth unit inductor 310 which is placed on the outer most position is connected to a second external terminal T2.

The first through fifth unit inductors 350, 340, 330, 320 and 310 are formed in a form of circle, square and other polygons by using the same connection metal wire so that each inductor could have inductance. Since the length of the connection metal wire becomes long from the first unit inductor 350 at the center to the fifth inductor 310 in the outer most position, self-inductance of the unit inductors is increased proportionally from the center to the outside. When the self-inductances of the first unit inductor 350, the second unit inductor 340, the third unit inductor 330, the fourth unit inductor 320 and the fifth unit inductor 310 are expressed as L11, L22, L33, L44 and L55, respectively, the magnitude of the self-inductances are: L55>L44>L33>L22>L11.

Although the first through fifth unit inductors 350, 340, 330, 320 and 310 are arranged in the form of plane in this embodiment, they can be arranged in the form of multi-layers separated from each other by using a dielectric substance between them. Also, although the unit inductor is plane type in this embodiment, a solenoid type inductor can be used as a unit inductor.

Figure 7:
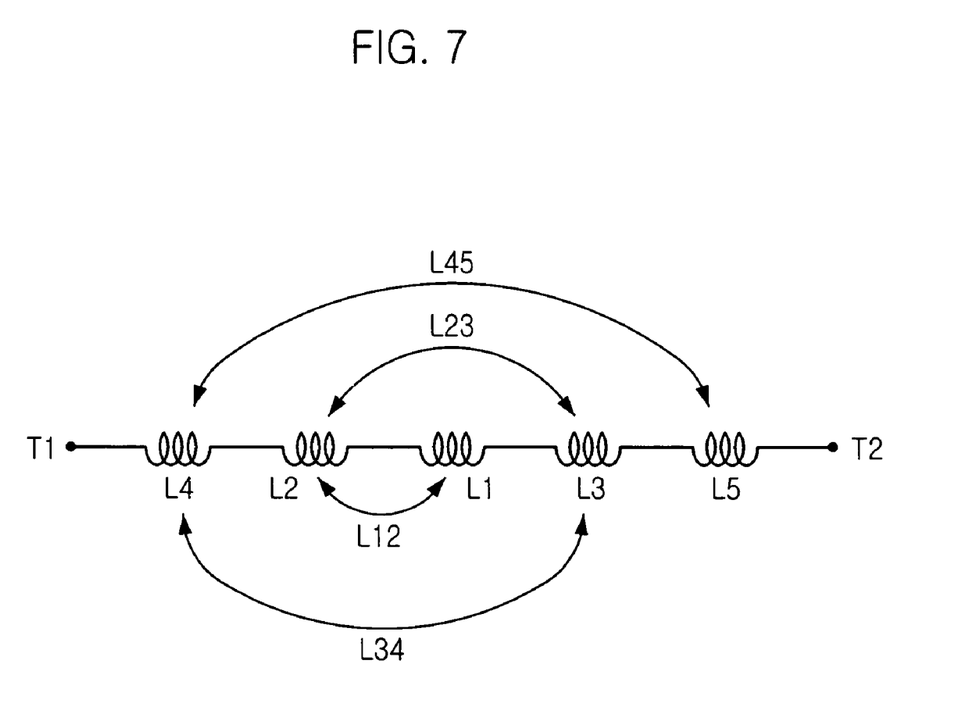
FIG. 7 is a schematic diagram describing a unit inductor of FIG. 6 which has self-inductance and mutual-inductance.

FIG. 7 is a schematic diagram describing a unit inductor of FIG. 6 which has self-inductance and mutual-inductance. As shown, the fifth unit inductor 310 is marked as L5, and the fourth, third, second and first unit inductors are marked as L4, L3, L2 and L1, respectively.

Referring to FIG. 7, the first through fifth unit inductors L1~L5, which are formed of metal wires and have self-inductances L11~L55 respectively, are connected in serial. Between the adjacent unit inductors, mutual-inductance is induced. The mutual-inductance is marked as L12, L23, L34, L45 in the drawing.

The sizes of the self-inductance L11, L22, L33, L44 and L55 and the mutual-inductance L12, L23, L34, L45 are different for a structural reason. Among the unit inductance values, the self-inductance L55 of the fifth unit inductor L5 which forms the most outer side of the metal wire 130 has the largest value, and then the mutual-inductance L44 induced between the fifth unit inductor L5 and the fourth unit inductor L4 which is positioned in the second outer most part has the largest mutual-inductance value.

The inductance value is decreased in proportion to the size of the area, because the self-inductance and the mutual-inductance are determined in proportion to the area occupied by each unit inductor and the area overlapped with another inductor. For example, Therefore, the mutual-inductance brings about the increase of the entire inductance.

In the present embodiment of this invention, the fifth unit inductor L5 located in the outer most part of the spiral coil and having the largest self-inductance and the fourth unit inductor L4 are connected to the second external terminal T2 and the first external terminal T1, respectively. The third, second and first unit inductors L3, L2 and L1 are connected in serial sequentially between the first and second terminals T1 and T2.

In other words, the two unit inductors having the largest self-inductances are arranged at both terminals so that the biggest mutual-inductance L45 could act on the two inductors. The mutual-inductance can be improved by arranging the other unit inductors between the fifths and fourth inductors in the same manner. Consequently, the inductance of the entire inductors can be improved and, thus, the value of quality factor is increased.

The technology of the present invention described above has an advantage that it can increase the value of quality factor without additional production cost and improve the quality factor at an arbitrary frequency by placing the unit inductors having the largest self-inductance at the locations adjacent to the external terminals when the unit inductors are arranged in the form of a serial circuit and the unit inductors are connected with each other through the connection metal wire, which is different from the conventional technology. Recent findings say that the effect of the technology suggested in the present invention can be maximized, when multi-layer metal wires of diverse thickness, which is now used for the fabrication of silicon devices, is used.

In the present invention, the quality factor and inductance of an inductor can be improved at a desired frequency band by changing the shape of the inductor simply during the fabrication process.

Since the technology suggested in the present invention is highly compatible with conventional semiconductor fabrication process, additional cost can be reduced. Moreover, the simple structure improves the reproducibility as well.

While the present invention has been described with respect to certain preferred embodiments, it will be apparent to those skilled in the art that various changes and modifications may be made without departing from the scope of the invention as defined in the following claims.

What is claimed is:

1. A method for arranging unit inductors of an inductor, wherein the inductor includes a first unit inductor, a second inductor and a third inductor, and self-inductance magnitudes of the unit inductors are in the order of the self-inductance of the third inductor>the self-inductance of the second inductor>the self-inductance of the first inductor, the method comprising the steps of:

a) coupling one end of the second unit inductor is connected to one end of the first unit inductor and one end of the third unit inductor to the other end of the first unit inductor in order to arrange the first unit inductor between the second and third unit inductors of which mutual-inductance has the largest value in mutual-inductances between the unit inductors;

b) coupling the second unit inductor to a first external terminal; and c) coupling the third unit inductor to a second external terminal.

2. The method as recited in claim 1, wherein the first to third unit inductors are connected to each other through metal wire.

3. The inductor as recited in claim 1, wherein the first, second and third unit inductors are arranged in a plane circle or polygon on a substrate.

4. The inductor as recited in claim 1, wherein the first, second and third unit inductors are formed in a shape of circle or polygon arranged in a multi-layer structure on a substrate.

5. The inductor as recited in claim 1, wherein each of the first, second and third unit inductors is a plane type inductor.

6. The inductor as recited in claim 1, wherein each of the first, second and third unit inductors is a solenoid type inductor.

* * * * *